United States Patent [19]

Tongel

[11] 4,445,775
[45] May 1, 1984

[54] REGISTRATION BLOCKS FOR A PHOTOMASK ASSEMBLY

[75] Inventor: Richard R. Tongel, Pittsburgh, Pa.

[73] Assignee: PPG Industries, Inc., Pittsburgh, Pa.

[21] Appl. No.: 362,693

[22] Filed: Mar. 29, 1982

[51] Int. Cl.³ .............................................. G03B 27/04
[52] U.S. Cl. ................................... 355/122; 355/133
[58] Field of Search ................. 355/75, 76, 79, 86, 355/91, 93, 95, 99, 113, 122, 125, 128, 132, 3; 354/275

[56] References Cited

U.S. PATENT DOCUMENTS

| | | | |
|---|---|---|---|
| 2,399,975 | 5/1946 | Ball | 355/122 X |
| 3,067,666 | 12/1962 | Coffman | 355/113 |
| 3,634,009 | 1/1972 | Van Dusen | 355/93 |
| 3,927,943 | 12/1975 | Pohl et al. | 355/132 |
| 3,957,371 | 5/1976 | Rich | 355/74 |
| 4,032,233 | 6/1977 | Oscarsson et al. | 355/91 |
| 4,159,176 | 6/1979 | de Masi | 355/79 |

Primary Examiner—Richard A. Wintercorn
Attorney, Agent, or Firm—Donna L. Seidel

[57] ABSTRACT

An alignment system for providing simple, efficient, repeatable and precise registration of a pair of plates in a photomask assembly for use in photolithographic imaging processes is disclosed, wherein registration blocks are attached to the edges of one plate and block stops are attached to the other plate in appropriate positions to engage said registration blocks when the plates are brought into parallel facing relationship in contact with a substrate to be processed.

20 Claims, 8 Drawing Figures

REGISTRATION BLOCKS FOR A PHOTOMASK ASSEMBLY

BACKGROUND OF THE INVENTION

FIELD OF THE INVENTION

The present invention relates generally to the art of producing printed circuits and chemically machined parts by photolithographic imaging processes using photomasks, and relates more particularly to the art of providing precise registration of a photomask assembly comprising a pair of glass plates with a common alignment (fiducial) mark on both plates and a photomask pattern.

DISCUSSION OF THE TECHNOLOGY

A printed circuit board comprises a substrate of insulator material and a circuit pattern of conductive material commonly formed by photolithographic processes. For example, a fiberglass board to be printed with circuitry is plated with copper and coated with a layer of photoresist material, a photosensitive polymer. The coated surface is then exposed to actinic radiation through a photomask master, a plate with some areas which are transparent to the actinic radiation and some areas which are not, to define the desired circuit pattern. The pattern is developed as a relief image in the photoresist by solvent treatment, the exposed and unexposed portions of the photosensitive polymer having different solubilities. The printed substrate may be either a positive or negative image of the photomask master depending upon whether a positive or negative working photopolymer is used. Typically, the unexposed photoresist is removed and the underlying copper etched away to leave a pattern of conductive copper in the image of the transparent pattern of the photomask.

Photomasks currently used in photolithographic processes such as the manufacture of printed circuits are typically glass plates coated with photographic emulsion, iron oxide or chromium having a pattern of transparent and opaque areas with respect to actinic radiation. The photomasks must be repeatedly registered in relation to photoresist coated substrates to accurately reproduce the desired pattern. For this reason, durable but opaque coating materials such as chromium may be less preferred than less durable coating materials which are more transparent with respect to visible light to facilitate alignment. The visually aligned assembly is exposed to actinic radiation which passes through the transparent areas of the photomask to photographically impose a pattern on the coated substrate, which is typically developed as relief image by dissolution of the unexposed photosensitive material. However, in the alternative, the exposed coating material may be removed by dissolution, or either the exposed or unexposed areas may be chemically treated. The chemistry of photolithographic processes is well-known, and any one of the conventional routes is acceptable to arrive at a circuit pattern on the substrate.

For high volume production, more durable photomasks have been developed wherein the pattern is a stained image within a glass plate, rather than a coating. These photomasks may be used many times in a photolithographic process to produce high resolution patterns. In many current applications, it is also useful to reduce the size of printed circuit boards by increasing the density of conductive lines, which requires increasing resolution, or by producing patterns on both sides of a substrate. Both increasing the resolution of a dense pattern and simultaneously printing both sides of a circuit board require that photomasks be precisely registered on both sides of the photoresist coated substrate. Therefore, when both sides of a photoresist coated substrate are to be exposed simultaneously, a durable dual photomask assembly which can be repetitiously realigned quickly and precisely is required.

An apparatus typically employed in the photolithographic processes described above generally comprises a pair of frames defining an enclosed space which can be evacuated. A pair of flexible photolithographic masters may be visually aligned and then manually secured individually to the frame members by such devices as tape, clamps or spring clips. Glass photomasks, on the other hand, are typically registered using cylindrical alignment pins fitted through the holes drilled through corresponding areas of the glass plates. A photopolymer coated substrate is precisely registered between the photomasks, and the assembly is evacuated and exposed to actinic radiation. When the substrate is removed from the assembly to develop the circuit pattern, the top glass plate must be lifted vertically and set aside until it is replaced over a fresh substrate. This process is costly, time-consuming and inaccurate, with the glass exposed to high risk of breakage. Therefore, improvements to the visual-manual registration technique have been sought.

For example, U.S. Pat. No. 3,634,009 to Van Dusen et al. discloses a method and device for accurately registering masters in operative relation in vacuum frame and photocomposition units. The invention involves an improvement in the provision of a metal strip cemented to the underside of a resilient rubber mat in the vacuum frame unit, together with two spring loaded locating pins projecting from the strip through the rubber mat and further through holes accurately punched in corresponding relation in photosensitive sheets of film art masters to effectively locate the sheet of film in extremely accurate relation on the mat to facilitate repeated accuracy in the development of such art work.

U.S. Pat. No. 4,159,176 to de Masi describes an exposure frame for aligning and holding flexible photomasks in registration with a printed circuit board coated with light sensitive material. The board is held between an independently adjustable mounting strip and slides. A contact strip is floated on the mounting strip by a spring mounting to permit the slides to position the printed circuit board relative to the photomask which is mounted on the adjustable mounting strip.

U.S. Pat. No. 4,032,233 to Oscarsson et al. describes an apparatus which facilitates the registry of image bearing transparencies with a plate having a photosensitive coating thereon. The registry apparatus includes upper and lower frames forming an enclosure on which the plates and transparencies are placed in sandwich relation. An outer gasket between the frames permits a vacuum to be applied to the enclosed space, while an inner perimeter channel permits a separate vacuum to hold the transparencies in place while the frames are opened to remove, insert or replace a plate, so that successive plates may be processed without registering the transparencies prior to each exposure.

U.S. Pat. No. 3,927,943 to Pohl et al. discloses the accomplishment of precisely aligned contact printing on opposite sides of a sensitized substrate by mounting first and second masks in first and second support members, adjusting the first support member to align the masks with respect to a common alignment pin, removing the second support member, mounting the substrate in a third support member, aligning the substrate with the first mask, forcing the substrate into contact with the first mask and magnetically holding it in place, removing the third support member, fastening the second support member to the first support member with the alignment pin, and drawing a vacuum between the masks to bring them into contact with opposite sides of the substrate. This technique provides mutual registration of the masks and substrate so that accurate photolithographic exposure of both sides of the substrate can be accomplished.

U.S. Pat. No. 3,957,371 to Rich discloses a locator pin which is part of an apparatus for maintaining accurate registration between a circuit board on which a conductive pattern is to be formed and a printing mask containing the image of the conductive pattern. The locator pin comprises a base member, an upright body member having a plurality of annularly arranged slots therein, and a threaded expansion pin fitting into the body member. The body member has a first cross-sectional area when the expansion pin is absent and a second cross-sectional area when the expansion pin is forcibly screwed into it. The first cross-sectional area is less than that of registration holes in the circuit board and printing mask to permit easy positioning, while the second cross-sectional area is at least as great as that of the registration holes to interlock the circuit board and printing mask in accurate registration.

SUMMARY OF THE INVENTION

The present invention provides for simple, efficient and accurate registration of plate in a photomask assembly by means of durable solid registration blocks permanently affixed to the edges or surfaces of the plates. The photomask assembly comprising the registration block system of the present invention provides simple, efficient, repeatable, accurate registration to precisely reproduce high resolution complex patterns. The photomask assembly of the present invention preferably comprises a hinged pair of plates, one of which comprises a registration block on each free edge and the other comprising corresponding block stops. The registration blocks and stops may have corresponding faces which are perpendicular to the plates, but preferably are notched, tapered or curved to facilitate registration of the plates. Preferably, at least one of the plates is a glass photomask.

DETAILED DESCRIPTION OF THE PREFERRED EMBODIMENTS

Figure 1:
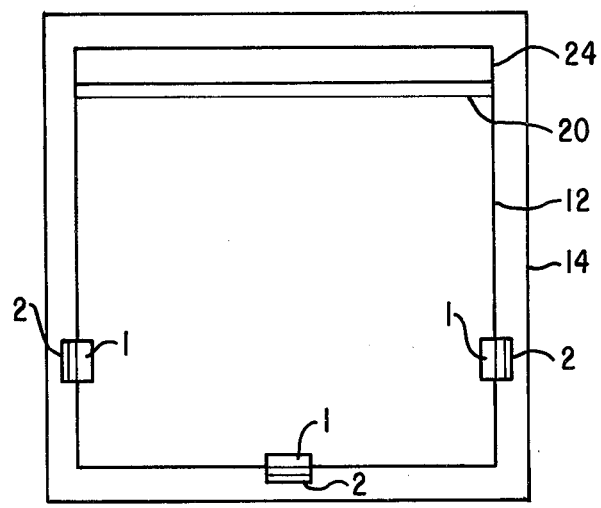
FIG. 1 illustrates a hinged photomask assembly incorporating a preferred registration system of the present invention. Top glass plate 12 is flexibly bonded along one edge to hinge plate 24 which is affixed to bottom glass plate 14, preferably with a spacer (not shown). Either or both of glass plates 12 and 14 may comprise a photomask pattern (not shown). A registration block 1 is attached to each free edge of top glass plate 12. Corresponding block stops 2 are attached to bottom plate 14 in such positions as to engage the registration blocks when the two plates are in parallel facing relationship spaced by the width of the substrate to be processed (not shown).
Figure 1A:
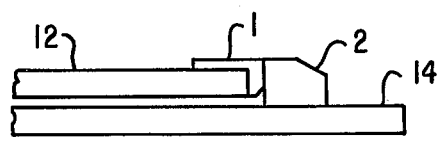
FIG. 1A is an enlarged cross-section of the block 1 and stop 2 of FIG. 1. A corner of block 1 is notched to facilitate engagement of the block 1 and stop 2 when the plates 12 and 14 to which they are attached are hinged together as in FIG. 1.
Figure 4:
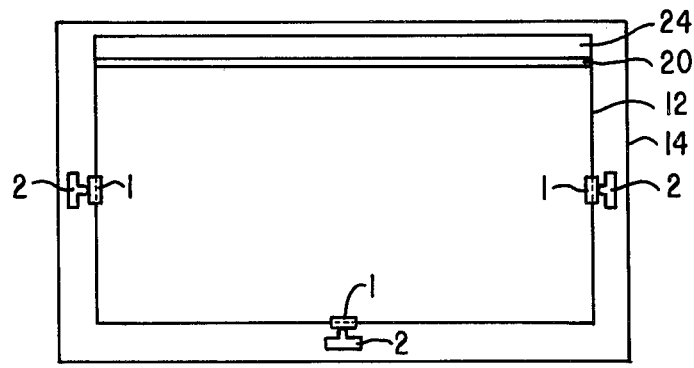
FIG. 4 illustrates an alternate embodiment of the present invention wherein the blocks 1 and stops 2 engage mutually perpendicular hemicylindrical portions.
Figure 4A:
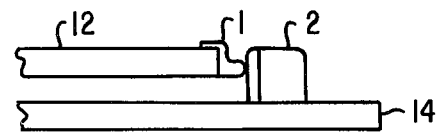
FIG. 4A shows the block 1 and stop 2 of FIG. 4 in enlarged cross-section.
Figure 5:
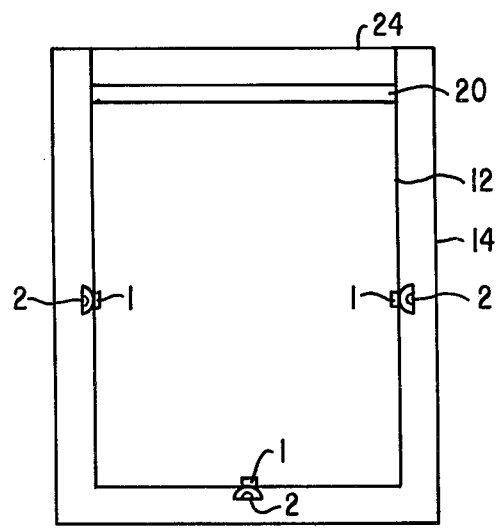
FIG. 5 illustrates an alternate embodiment wherein the blocks 1 are shaped and positioned as in FIG. 1 and the stops 2 present a hemicylindrical portion for engagement with blocks 1.
Figure 5A:
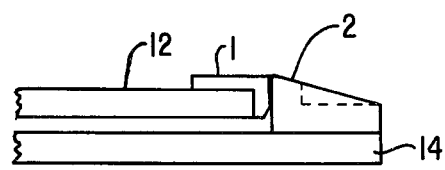
FIG. 5A shows the block and stop of FIG. 5 in enlarged cross-section.

Two glass plates with a registration block alignment system of the present invention are preferably joined by a flexible polymeric hinge in accordance with U.S. Pat. No. 4,412,739 to Freiberg, the disclosure of which is incorporated herein by reference, to form a permanently registered photomask assembly according to the following procedure, by which preferred articles as illustrated in FIGS. 1, 4 and 5 are produced.

First, glass plates are washed, preferably with pumice and water. Preferably, at least one of a pair of plates is a glass photomask. When the pumice is dry, the surfaces are preferably wiped clean with a lint-free cloth or paper towel. One plate 12 is preferably placed in a horizontal position on a supporting fixture. A polymeric hinge material 20, preferably a silicone extrusion product, is placed on the supporting fixture along the edge of the glass plate 12. The width of the silicone bead 20 is preferably slightly larger than the desired final width of the hinge. The area of the supporting fixture underlying the polymeric hinge material 20 is preferably coated with a release film such as TEFLON ® polytetrafluoroethylene. A hinge plate 24, preferably a narrow strip of glass about the same length as the glass plate, is placed on the supporting fixture and pressed into the silicone hinge material 20, which is compressed between the hinge plate 24 and glass plate 12 to the desired final hinge width. Preferably, a cover bar is clamped over the hinge assembly. The supporting fixture carrying the glass plate 12, polymeric hinge material 20 and hinge plate 24 is placed in an oven to cure the silicone composition. When the polymeric hinge material is cured, the assembly is cooled to room temperature and tested, by flexing the hinge until the glass plate and hinge plate are at an angle of 90°, to determine the flexibility of the polymeric hinge and its adhesion to the glass plate and hinge plate.

Durable, rigid, preferably solid metal, registration blocks are attached to the three free edges of the glass plate, preferably near the center of each edge. The hinged glass plate is then optically aligned with the second glass plate 14, with the two plates separated by a space equal to the average thickness of the substrates to be processed. If the blocks and stops have engaging portions which are perpendicular to the plate surfaces, as is preferred, the plates may be aligned in face-to-face contact. Block stops 2 are attached to the bottom plate 5 in the appropriate positions to engage the registration blocks when the two plates are brought into parallel facing relation spaced by the average thickness of the substrates to be processed. Finally, the glass plate 12 is joined to the glass plate 14 by bonding the hinge plate 24 to the bottom glass plate to form a permanently registered photomask assembly. Preferably, the hinge plate 24 is bonded to a spacer which in turn is bonded to the bottom plate 14. The spacer is a flat strip of non-compressible material, preferably glass. The spacer is preferably about the same length and width as the hinge plate 24, and the same thickness as the substrates to be processed. A preferred adhesive which may be used for bonding the hinge plate to the bottom glass plate is a cyanoacrylate composition available from Loctite Corporation as Loctite 352 speed bonder which is curable with ultraviolet radiation. Preferably, the polymeric hinge material 20 is slightly compressed when the hinge plate 24 is bonded to the bottom glass plate 14 to ensure precise engagement of the registration block and stop on the opposite edge.

The photomask portion of the assembly may be a patterned coating of photographic emulsion, iron oxide or chromium on either or both of the glass plates, or any conventional photomask material. However, it is preferred that one or both of the glass plates bear a photomask image in the form of a stain pattern within the glass plate. A preferred photomask plate may be prepared by coating a glass plate with a photographic emulsion comprising a dispersion of silver halide in gelatin which is exposed to light through a master pattern. Exposed areas of the photographic emulsion form a latent image which is further developed by immersion in developing solutions which convert the silver halide to colloidal silver, while the unexposed emulsion is removed. The silver coated glass plate is subjected to conditions which cause migration of silver ions into the glass. While heat alone may be sufficient, preferably electron bombardment or an electric field is employed to minimize diffusion of the pattern. The silver ions are then reduced to elemental silver and agglomerated into colloidal microcrystalline color centers which form a stain pattern within the glass. The reduction and agglomeration of silver are preferably accomplished by heating in the presence of reducing ions, such as copper ions or the tin ions found in many glass compositions, or in a reducing atmosphere.

Most glass compositions are useful in accordance with the present invention with respect to the registration block system and the polymeric hinge. In preferred embodiments wherein the glass plate comprises a photomask image in the form of an internal stain pattern, the glass composition requires mobile cations which migrate under the conditions imposed for migration of the silver ions, in order to provide sites for the silver ions within the glass. Typical soda-lime-silica glaass compositions contain an abundant supply of mobile alkali metal ions, while typical float glass compositions contain, in addition to mobile alkali metal ions, tin ions which may be utilized to reduce the silver ions migrated into the glass from the photographic emulsion.

Photographic emulsions useful in accordance with preferred embodiments of the present invention are those which, upon exposure and development, produce a pattern containing silver with sufficient electrical conductivity to facilitate electromigration of silver ions into the glass in order to avoid the pattern diffusion associated with purely thermal migration. In addition, the photographic emulsion should itself have high resolving power in order to maximize the resolution of the pattern reproduced in the photomask plate. Detailed descriptions of methods for forming glass photomasks which are preferred for use in accordance with the present invention are found in U.S. Pat. Nos. 4,144,066 and 4,155,735 to Ernsberger, the disclosures of which are incorporated herein by reference.

In most preferred embodiments of the present invention, both glass plates are photomask plates and precise registration of the plates is crucial. Therefore, the polymeric hinge material must be flexible and extensible enough to accommodate variations in thickness of the substrates to be printed without stretching or loosening with repeated usage, as described in U.S. Pat. No. 4,412,739 to Freiberg the disclosure of which is incorporated herein by reference. Polymeric materials useful in accordance with the present invention must be flexible, but not deformative, in the cured state, and must be adherent to the glass. Preferred polymeric compositions include silicones, preferably in the form of an extruded bead Preferred silicone compositions in accordance with the present invention include phenyl-methyl-vinyl siloxane polymers, and preferably further include a curing agent and an adhesion promoter. A preferred curing agent is benzoyl peroxide, and a preferred adhesion promoter is glycidoxypropyltrimethoxysilane. The preferred silicone compositions typically cure at moderate temperatures in relatively short times to a Shore A hardness of about 25 to 70, preferably about 30 to 50, at ambient temperature.

Figure 2:
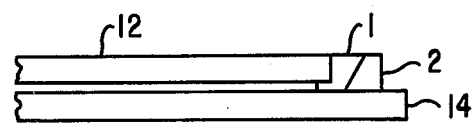
FIG. 2 is a cross-sectional view of a registration block system wherein the engaging faces are not perpendicular to the parallel facing surfaces of the plates. As illustrated, block 1 also acts as a spacer between plates 12 and 14 in engagement with stop 2 when the plates are brought together into parallel facing relation.
Figure 3:
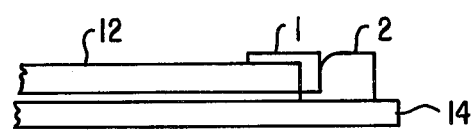
FIG. 3 is a cross-sectional view of an alternative registration block system wherein stop 2 acts as a spacer and has a curved top portion to facilitate engagement with block 1 when plates 12 and 14 are hinged together as in FIG. 1.

The registration block alignment system of the present invention must be durable and machinable to precise tolerances. Preferably, the the registration blocks 1 and the block stops 2 are stainless steel. If the engaging portions of the blocks and stops are not perpendicular to the parallel facing surfaces of the plates, the angle by which the engaging portions deviate from the perpendicular is preferably about 10°, as shown in FIG. 2. In a most preferred embodiment of the present invention, the engaging portions of either or both the registration blocks 1 and stops 2 are cylindrical, as shown in FIGS. 4, 4A, 5 and 5A. Preferably, at least one of the registration blocks or stops comprises a portion which prevents contact of the glass plates in parallel facing relation by a space substantially equivalent to the average thickness of the substrates to be processed, as shown in FIGS. 2 and 3.

The present invention will be further understood from the description of a specific example which follows.

EXAMPLE I

One glass photomask is placed in a horizontal position on a supporting frame. A silicone extrusion product ½ by 3/16 inch (about 12.7 by 4.8 millimeters) is placed along the edge of the glass plate. The area of the supporting fixture under the silicone bead is coated with TEFLON ® polytetrafluoroethylene. The silicone composition comprises 100 parts by weight of a silicone rubber available as Silastic 1125 U from Dow Corning, 0.8 parts by weight of 50 percent benzoyl peroxide in silicone oil available as Cadox BS Paste from Nourly Chemical Corporation, and 1.0 parts by weight of glycidoxypropyltrimethoxysilane available as Z-6040 from Dow Corning. A glass hinge plate ¾ inch (about 19 millimeters) wide is placed in a horizontal position on the supporting fixture and is pressed into the silicone extrusion, compressing it to a thickness of ⅜ inch (about 9.5 millimeters) against the glass plate. A cover bar is placed over this hinge assembly and secured with bookbinder clamps. The supporting fixture carrying the glass plate, silicone hinge material and hinge plate is placed in an oven at 300° F. (about 139° C.) for 20 minutes. The assembly is then removed from the oven and cooled to room temperature. The hinge, tested by bending the assembly so that the glass photomask and hinge plate are at an angle of 90°, exhibits good flexibility and adhesion to the glass, and has a Shore A hardness of 50 at ambient temperature. Registration blocks made of stainless steel and shaped as shown in FIG. 1 are attached to the three free edges of the hinged plate using an anaerobic acrylic adhesive, available as Loctite 324 from Loctite Corporation, which cures at room temperature in about 5 minutes. The hinged assembly is then optically aligned in face-to-face contact with a second glass photomask and the alignment system fixed into position by attaching stainless steel block stops shaped as shown in FIG. 1 to positions on the bottom plate from which the block stops will engage the registration blocks when the hinged photomask and bottom photomask are brought into facing spaced relationship. The hinged top photomask is then joined to the bottom photomask by bonding the hinge plate to a glass spacer which in turn is bonded to the bottom glass photomask while slightly compressing the silicone hinge. The adhesive used for bonding the hinge plate to the spacer and the spacer to the bottom photomask is a cyano-acrylate composition available from Loctite Corporation as Loctite 352 speed bonder, which cures upon exposure to ultraviolet radiation. The finished unit provides efficient, repeatable precise registration in repeated uses.

The above example is offered to illustrate the present invention which includes various modifications. Photomask assemblies comprising plates of various materials other than glass may benefit from the registration block alignment system of the present invention. While hinged assemblies are preferred for their convenience, separate plates may be advantageously registered using the registration block alignment system of the present invention. The registration blocks and stops may be formed in a variety of shapes, and of durable, rigid materials other than metals, such as nylon and other synthetics. In the preferred hinged glass photomask assemblies, flexible polymers other than silicone may be employed, may be cured by means other than heat, may be bonded to glass using primers, and may be bonded directly between two plates without the preferred hinge plate, which need not be glass. While the use of a spacer is preferred, the spacer for the substrate to be processed may be defined by offsetting the hinge plate and by using blocks or stops with spacer portions. As previously mentioned, the photomask may be in any known form but is preferably a stained pattern in a glass plate. Any means of registration may be used to align a photoresist coated substrate within the hinged photomask assembly comprising the registration block alignment system of the present invention, the scope of which is defined by the following claims.

I claim:

1. A precisely registerable assembly for use in a photolithographic imaging process which comprises:
   a. a first rigid plate to which are affixed a plurality of registration blocks about the perimeter thereof; and
   b. a second plate to which are affixed an equal number of block stops positioned to engage said registration blocks when said plates are brought into facing spaced relationship,
   wherein the number of blocks and stops is sufficient to prevent relative lateral movement of the plates in their respective planes.

2. An article according to claim 1, wherein said plates are glass.

3. An article according to claim 2, wherein said first plate is attached to said second plate by hinge means.

4. An article according to claim 3, wherein said glass plates are joined by hinge means comprising a flexible polymeric hinge material.

5. An article according to claim 4, wherein said hinge means further comprises a hinge plate flexibly bonded to said first plate by means of said hinge material and fixedly bonded to said second plate.

6. An article according to claim 4, wherein at least one of said plates is a glass photomask.

7. A precisely registerable, hinged photomask assembly for use in a photolithographic imaging process which comprises:
   a. a first glass plate attached along one edge to hinge means;
   b. affixed to said first glass plate a plurality of registration blocks attached about the perimeter of said plate elsewhere than along the edge attached to said hinge means;
   c. a second glass plate joined to said first plate by said hinge means;
   d. affixed to said second glass plate an equal number of block stops positioned to engage said registration blocks when said first and second plates are in facing relation spaced at a distance substantially equivalent to the thickness of substrates to be processed,
   wherein the number of blocks and stops is sufficient to prevent relative lateral movement of said plates in their respective planes.

8. An article according to claim 7, wherein said hinge means comprises a flexible polymeric hinge joining said first glass plate and a hinge plate which is affixed to said second glass plate, and at least one of said glass plates comprises a photomask image.

9. A precisely registerable, hinged photomask assembly for use in a photolithographic imaging process which comprises:
   a. a first glass plate attached along one edge to hinge means;
   b. affixed to said first glass plate a plurality of registration blocks attached about the perimeter of said plate elsewhere than along the edge attached to said hinge means;
   c. a second glass plate joined to said first plate by said hinge means; and
   d. affixed to said second glass plate an equal number of block stops positioned to engage said registration blocks when said first and second plates are in facing relation spaced at a distance substantially equivalent to the thickness of substrates to be processed,
   wherein the number of blocks and stops is sufficient to prevent lateral movement of said plates in their respective planes, said hinge means comprises a flexible polymeric hinge which is a silicone composition joining said first glass plate and a hinge plate which is affixed to said second glass plate, and at least one of said glass plates comprises a photomask image comprising a stain pattern within the glass.

10. An article according to claim 7, wherein said registration block and said block stop are produced from a durable material selected from the group consisting of brass, stainless steel and nylon.

11. A method for precise registration of a pair of plates in a photomask assembly for use in a photolithographic imaging process comprising the steps of:
   a. affixing to designated locations on a first plate a plurality of registration blocks;
   b. affixing to corresponding locations on a second plate an equal number of block stops;
   c. bringing said plates together, whereby said blocks engage said stops to register said plates in spaced facing relation, wherein the number of blocks and stops is sufficient to prevent relative lateral movement of said plates in their respective planes.

12. The method according to claim 11, wherein said plates are glass.

13. A method for precise registration of a pair of glass plates in a photomask assembly for use in a photolithographic imaging process comprising the steps of:
   a. affixing to designated locations on a first plate a plurality of registration blocks;
   b. affixing to corresponding locations on a second plate an equal number of block stops;
   c. bringing said plates together, whereby said blocks engage said stops to register said plates in spaced facing relation, wherein the number of blocks and stops is sufficient to prevent relative lateral movement of said plates in their respective planes and at least one of said glass plates comprises a photomask image present as a stain pattern within said glass plate.

14. The method according to claim 13, wherein both glass plates are glass photomasks.

15. The method according to claim 12, wherein said glass plates are joined by hinge means.

16. The method according to claim 15, wherein said hinge means comprises a flexible polymeric hinge material.

17. The method according to claim 16, wherein said polymeric hinge material is a silicone composition.

18. The method according to claim 16, wherein said hinge means further comprises a hinge plate flexibly joined to said first plate by said polymeric hinge material and affixed to said second plate.

19. The method according to claim 8, wherein said first plate is a glass photomask.

20. The method according to claim 19, wherein said second plate is a glass photomask.

* * * * *